(12) United States Patent
Summerlin et al.

(10) Patent No.: US 6,268,755 B1
(45) Date of Patent: Jul. 31, 2001

(54) MOSFET PREDRIVE CIRCUIT WITH INDEPENDENT CONTROL OF THE OUTPUT VOLTAGE RISE AND FALL TIME, WITH IMPROVED LATCH IMMUNITY

(75) Inventors: R. Travis Summerlin, Parker; Joseph A. Devore; William E. Grose, both of Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/963,836

(22) Filed: Nov. 4, 1997

(51) Int. Cl.[7] .............................................. H03K 19/0185
(52) U.S. Cl. ............................................. 327/333; 326/81
(58) Field of Search .................................. 327/333, 55, 57, 327/134, 170, 380, 381, 389, 391; 326/80, 81

(56) References Cited

U.S. PATENT DOCUMENTS 5,465,069 * 11/1995 Boiron et al. ........................ 327/333
5,559,464 * 9/1996 Orii et al. ............................ 327/333
5,666,070 * 9/1997 Merritt et al. ......................... 326/81
5,748,024 * 5/1998 Takahashi et al. .................... 327/333
5,834,948 * 11/1998 Yoshizaki et al. ...................... 326/81

* cited by examiner

Primary Examiner—Toan Tran
(74) Attorney, Agent, or Firm—April M. Mosby; W. James Brady; Frederick J. Telecky, Jr.

(57) ABSTRACT

A voltage level shifting circuit (60) and method for accomplishing a voltage level change includes a voltage level shifting circuit (65) to change an input voltage to a shifted voltage level. A second stage (67) is connected between a voltage source at the shifted voltage level (68) and the reference potential. The second stage (67) includes active devices (66,82) that are controlled by the voltage level shifting circuit (65). The second stage (67) also includes slope resistors (86,88) connected in series between the active devices (66,82) of the second stage (67).

2 Claims, 1 Drawing Sheet

MOSFET PREDRIVE CIRCUIT WITH INDEPENDENT CONTROL OF THE OUTPUT VOLTAGE RISE AND FALL TIME, WITH IMPROVED LATCH IMMUNITY

BACKGROUND OF THE INVENTION

1. Field of the Invention

This invention relates to improvements in electronic circuitry, and more particularly to circuitry and techniques for voltage level adjusting, controlling, and setting.

2. Relevant Background

In many applications, it is desirable or necessary to adjust or shift a voltage level from one electronic stage to an adjacent stage. For example, it is often desirable to shift TTL voltage levels, typically on the order of 0 to 5 volts, to higher voltage levels, for instance, on the order of 0 to $V_{SHFT}$, where $V_{SHFT}$ may be 40 volts, or more. However, in the past, level shifters, and particularly, level shifters that use integrated slope control resistors can be susceptible to latching in one state. This, of course, is undesirable.

More specifically, a level shifter circuit 10, which can be used to drive a large output MOSFET (not shown), according to one prior art embodiment is shown in FIG. 1. The circuit 10 includes four MOS transistors 11–14. Transistors 11 and 12 are, in the embodiment shown, p-channel MOS devices connected between a voltage source, $V_{SHFT}$, 16 and output nodes 18 and 20. Transistors 13 and 14, on the other hand, are n-channel MOS transistors, which are connected respectively between the output nodes 18 and 20 to a reference potential or ground 22.

An input signal or voltage level on line 24 is applied to the gate of transistor 14, and is inverted by an inverter 26 and applied to the gate of the N-channel transistor 13. The gate of the p-channel transistor 12 is connected to the output node 18, and the gate of the p-channel transister 11 is connected to the output node 20.

The switching speed of this level shifter will only be a function of the on-resistance of transistors 12 and 14 and the gate charge characteristic of the output MOSFET. As a result, the switching speed may be extremely fast, which may be undesirable, especially when the output is used to drive loads that are prone to cause electromagnetic interference (EMI) due rapidly changing currents in long wires.

To address this problem, a circuit such as the circuit 30 shown in FIG. 2, has been proposed. The level shifting circuit 30 includes four transistors, 32–35 connected in series between a voltage, $V_{SHFT}$ 38 and a reference potential such as ground 40. The gate of p-channel transistor 32 is connected to the drain of the p-channel transistor 33 and, likewise, the gate of the transistor 33 is connected to the drain of transistor 32.

The input line 42 is connected to the gate of the n-channel transistor 35, is inverted by an inverter 44, and is connected to the gate of the n-channel transistor 34. In the circuit embodiment 30 of FIG. 2, a resistor 46 is provided between the drain of the p-channel transistor 33 and the output node 48. In addition, a resistor 50 is connected between the output node 48 and an output terminal 52, which may be connected to drive a large MOSFET transistor (not shown), or other appropriate load.

In the circuit 30 of FIG. 2, the switching speed is not instantaneous, but is a function of the values of resistors 46 and 50, since the on-resistance of the transistors 33 and 35 is negligible compared to-the resistances of resistors 46 and 50.

Although the circuit 30 of FIG. 2 addresses the above problems caused the instantaneous switching time, the circuit 30 has two problems. The first problem is that while the rise time of the output of the circuit 30 is a function primarily of the value of resistance 50, the fall time of the output is a function primarily of the series combination of the resistors 46 and 50. This makes setting the fall time with precision difficult. The second, and more serious, problem is that the ability of the level shifter circuit 30 to switch states is predicated on the ability of transistor 35 to pull the drain of transistor 33 down to the ground potential. This simultaneously switches transistor 32 on. If the value of resistor 50 becomes too large, the operation of the level shifter circuit 30 may be compromised.

SUMMARY OF THE INVENTION

In light of the above, therefore, it is an object of the invention to provide an improved level shifter circuit.

It is another object of the invention to provide a level shifter circuit of the type described that enables the slope of the output signal to be controlled.

It is yet another object of the invention to provide a level shifter circuit of the type described that allows the rise time of the output signal to be controlled independently of the fall time, and visa versa.

It is yet another object of the invention to provide a level shifter circuit of the type described that enables reliable, consistent switching of the circuit.

These and other objects, features and advantages of the invention will be apparent to those skilled in the art from the following detailed description of the invention, when read in conjunction with the accompanying drawings and appended claims.

According to a broad aspect of the invention, a second stage onto a voltage level shifter circuit. The second stage separates the slope control resistors from the level shifting function, and placing the slope control resistors to allow the rise time to be a function of one of the resistors, and the fall time to be a function of the other resistor.

More particularly, according to a broad aspect of the invention, a voltage level shifting circuits is presented that includes a voltage level shifting circuit to change an input voltage to a shifted voltage level. A second stage is connected between a voltage source at the shifted voltage level and the reference potential, or ground. The second stage includes active devices that are controlled by the voltage level shifting circuit. The second stage also includes slope controlling devices to control a slope of a voltage transition at an output in response to an input voltage change. The active devices of the second stage may be transistors connected between the voltage source and the reference potential. The slope controlling devices may be resistors connected in series between the transistors of the second stage, a circuit output being derived from a connected between the resistors. The transistors of the second stage may be MOS transistors.

The voltage level shifting circuit may be of the type that includes first and second transistors connected between the voltage source and a reference potential, and third and fourth transistors connected between the voltage source and the reference potential. An input voltage is connected a gate of the fourth transistor, and an inverted input voltage is connected to a gate of the second transistor. A gate of the first transistor is connected to a drain of the third transistor, and a gate of the third transistor is connected to a drain of the first transistor. The first, second, third and fourth transistors may be MOS transistors.

According to another broad aspect of the invention, a method is presented for controlling transition slopes of a voltage level shifting circuit. The method includes providing first and second series connected slope controlling devices and providing first and second active devices. The method additionally includes interconnecting said slope controlling devices in series between said first and second active devices and interconnecting said first and second active devices and said series connected first and second active devices between a voltage source at a shifted voltage level and reference potential. The step of providing first and second active devices may be performed by providing first and second transistors, and the step of providing first and second active devices may be performed by providing first and second MOS transistors.

BRIEF DESCRIPTION OF THE DRAWINGS

The invention is illustrated in the accompanying drawings, in which.

In the various figures of the drawing, like reference numerals are used to denote like or similar parts.

DETAILED DESCRIPTION OF THE PREFERRED EMBODIMENTS

Figure 1:
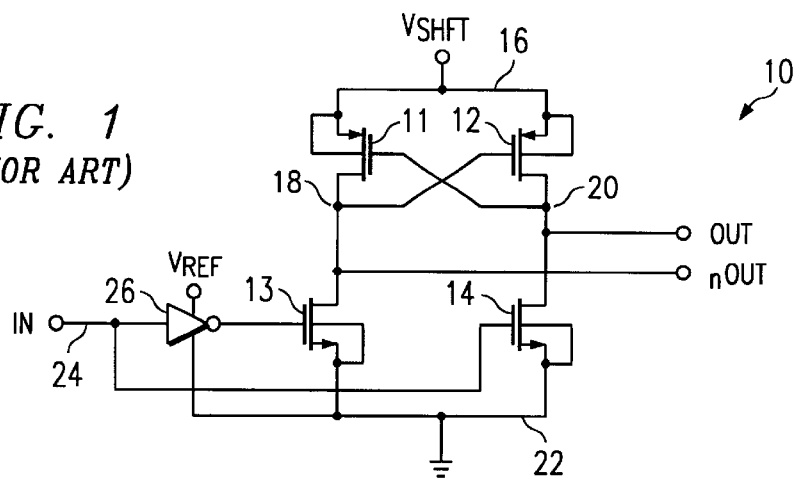
FIG. 1 is an electrical schematic diagram, illustrating a level shifter circuit that can be used to drive a large output MOSFET, in accordance with the prior art.
Figure 2:
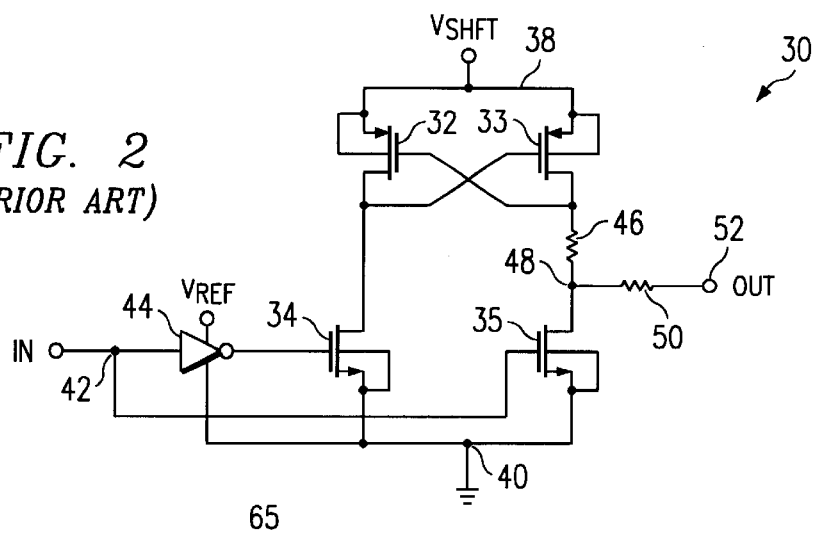
FIG. 2 is an electrical schematic diagram, illustrating a level shifter circuit enhancement of the circuit of FIG. 1, in accordance with the prior art.
Figure 3:
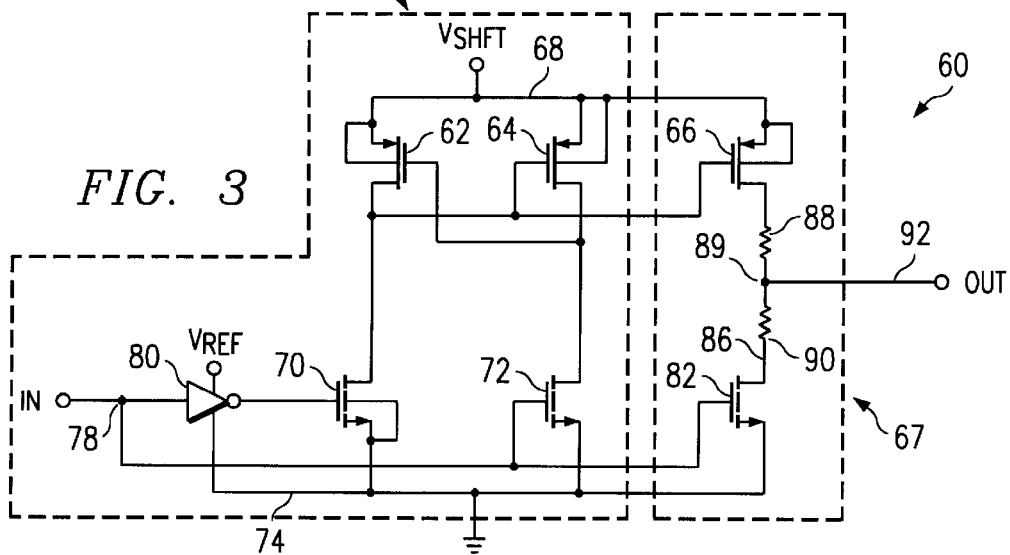
FIG. 3 is an electrical schematic diagram, illustrating a level shifter circuit using separate slope control resistors in a second stage, in accordance with the a preferred embodiment of the invention.

An embodiment of a level shifter circuit 60 according to a preferred embodiment of the invention is shown in FIG. 3. The circuit 60 includes a first stage 65 and a second stage 67. The first stage 65 includes level shifting MOS transistors 62 and 64, connected with their source elements connected to a supply bus 68. The voltage $V_{SHFT}$ applied to the supply bus 68 represents the maximum voltage level to which the input voltage on line 78 is shifted.

The gate of MOS transistor 62 is connected to the drain of MOS transistor 64, and the gates of MOS transistor 64 is connected to the drain of transistor 62. MOSFET transistors 70 and 72 are respectively connected in series with transistors 62 and 64 to a reference potential or ground on bus 74. The gate of MOS transistor 72 is connected to the input line 78, which also is connected to the input of an inverter 80. The gate of the MOS transistor 70 is connected to the output of the inverter 80.

A second stage 67 is provided, which includes a p-channel MOS transistor 66 and an n-channel MOS transistor 82 connected between the supply bus 68 and the ground bus 74. The gate of the upper MOS transistor 66 is connected to the gate of the MOS transistor 64 of the level shifting circuit 65, and the gate of the lower MOS transistor 83 is connected to the input line 78. Slope controlling resistors 88 and 90 are connected in series between the MOS transistors 66 and 82, and the circuit output is derived on line 92 at the node 89 between the slope controlling resistors 88 and 90.

The circuit of FIG. 3 separates the slope control resistors 88 and 90 from the level shifter 65 by virtue of their placement in the second stage 67. The placement of the slope control resistors 88 and 90 also allows the rise time to be a function of resistor 90, independently of the fall time which is a function of resistor 88. It can be seen that with proper sizing of the transistors 62 and 70 with respect to the sizing of transistors 64 and 72, reliable, consistent switching under all conditions can be achieved.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A voltage level shifting circuit, comprising:

a first stage to change an input voltage to a shifted voltage level;

the first stage including a first and second MOS transistors directly connected between a voltage source and a reference potential;

the first stage further including a third and fourth MOS transistors directly connected between the voltage source and the reference potential;

an input voltage being connected to a gate of the fourth transistor, and an inverted input voltage being connected to a gate of the second transistor;

a gate of the first transistor being connected to the drain of the third transistor, and a gate of the third transistor being connected to a drain of said first transistor;

a backgate of each of the first and third transistors connected to the voltage source, and a backgate of each of the second and fourth MOS transistors connected to the reference potential; and a second stage being connected between the voltage source and the reference potential, said second stage including a fifth and sixth MOS transistor that are controlled by said first stage, said fifth and sixth transistor connected between the voltage source and the reference potential, said second stage further including a first and second resistor to control a slope of a voltage transition at an output in response to the input voltage change;

said first and second resistors are directly coupled in series between said fifth and sixth transistors, said first and second resistors form a circuit output;

a gate of said fifth transistor is resistor is connected to the gate of said third transistor and a gate of said sixth transistor is connected to receive to receive the input voltage.

2. The voltage level shifting circuit of claim 1 wherein said first and third transistors are p-channel MOS transistors and said second and fourth transistors are n-channel transistors.

* * * * *

UNITED STATES PATENT AND TRADEMARK OFFICE
CERTIFICATE OF CORRECTION

PATENT NO.    : 6,268,755 B1
DATED         : July 31, 2001
INVENTOR(S)   : Travis Summerlin It is certified that error appears in the above-identified patent and that said Letters Patent is hereby corrected as shown below:

<u>Title page,</u>
Item [60], insert -- [60] Related U.S. Application Data
Provisional Application No. 60/031,093 filed 11/20/1996. --

Signed and Sealed this

Eighteenth Day of March, 2003

JAMES E. ROGAN
*Director of the United States Patent and Trademark Office*